(12) United States Patent
Woo et al.

(10) Patent No.: US 12,424,975 B2
(45) Date of Patent: Sep. 23, 2025

(54) SEMICONDUCTOR DEVICE AND COMMUNICATION DEVICE COMPRISING THE SAME

(71) Applicant: SAMSUNG ELECTRONICS CO., LTD., Suwon-si (KR)

(72) Inventors: Jeong Kyun Woo, Suwon-si (KR); Seong Won Joo, Seoul (KR); Sang Sung Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 516 days.

(21) Appl. No.: 18/053,241

(22) Filed: Nov. 7, 2022

(65) Prior Publication Data

US 2023/0163725 A1 May 25, 2023

(30) Foreign Application Priority Data

Nov. 25, 2021 (KR) .................. 10-2021-0164226
May 24, 2022 (KR) .................. 10-2022-0063323

(51) Int. Cl.
*H03F 1/02* (2006.01)
*H03F 1/08* (2006.01)
(Continued)

(52) U.S. Cl.
CPC .......... *H03F 1/0211* (2013.01); *H03F 1/083* (2013.01); *H03K 17/687* (2013.01)

(58) Field of Classification Search
CPC ............ H03F 1/0211; H03F 1/083; H03F 2200/294; H03F 2200/451; H03F 3/19; H03F 3/245; H03F 2203/45418; H03F 2203/45424; H03F 2203/45526; H03F 1/086; H03F 3/45659; H03F 3/45183; H03F 3/45475; H03F 3/72; H03F 1/32;
(Continued)

(56) References Cited

U.S. PATENT DOCUMENTS 7,019,580 B1  3/2006 Michalski
7,129,782 B2 * 10/2006 Lebedev ............. H03F 3/45192
                                                      330/253
(Continued)

FOREIGN PATENT DOCUMENTS

KR          101491929        2/2015

*Primary Examiner* — Hieu P Nguyen
(74) *Attorney, Agent, or Firm* — Morgan, Lewis & Bockius LLP

(57) ABSTRACT

An amplifier includes a first amplification circuit, a second amplification circuit including first and second amplification transistors controlled by the first amplification circuit to generate first and second output signals and a bias transistor turned on based on a bias signal to generate the first output signal, a filter circuit including a bias capacitor connected to the first amplification transistor and the bias transistor to generate the first bias signal using a first bias voltage, and a feedback circuit configured to receive the first and second output signals and output a feedback signal that adjusts an average of the first and second output signals to correspond to a reference signal, to the first amplifier. The filter circuit adjusts a voltage of the bias capacitor such that a voltage of the bias capacitor when the amplifier is disabled corresponds to a voltage of the bias capacitor when the amplifier is enabled.

20 Claims, 9 Drawing Sheets

(51) Int. Cl.
*H03F 3/45* (2006.01)
*H03K 17/687* (2006.01)

(58) Field of Classification Search
CPC .......... H03F 1/30; H03F 1/34; H03F 3/45479; H03K 17/687; H03H 9/46
USPC ................................. 330/252–261, 69, 297
See application file for complete search history.

(56) References Cited

U.S. PATENT DOCUMENTS

| | | |
|---|---|---|
| 7,999,612 B2 * | 8/2011 | Hsieh ...................... H03F 3/005 330/69 |
| 10,778,093 B2 | 9/2020 | Piccardi |
| 11,038,418 B2 | 6/2021 | Low et al. |
| 11,063,516 B1 | 7/2021 | Kim et al. |
| 2015/0162898 A1 | 6/2015 | Bose et al. |
| 2021/0328508 A1 | 10/2021 | Balaz et al. |

* cited by examiner

SEMICONDUCTOR DEVICE AND COMMUNICATION DEVICE COMPRISING THE SAME

CROSS-REFERENCE TO RELATED APPLICATION

This U.S. non-provisional patent application claims priority under 35 U.S.C. 119 to Korean Patent Application No. 10-2021-0164226 filed on Nov. 25, 2021, and priority to Korean Patent Application No. 10-2022-0063323 filed on May 24, 2022, in the Korean Intellectual Property Office, the disclosure of which are incorporated by reference in their entireties herein.

1. TECHNICAL FIELD

The present disclosure relates to a semiconductor device and a communication device comprising the same.

2. DISCUSSION OF RELATED ART

A semiconductor device may include an amplifier to increase the power of a signal. The amount of amplification provided by the amplifier is measured by its gain. All amplifiers include some form of active device. Transistor amplifiers are the most common type of amplifier. A transistor is used as the active element in a transistor amplifier. The gain of a transistor amplifier is determined by the properties of the transistor as well as the circuit the transistor is contained within.

Analog communication systems may include the transistor amplifier. However, when an analog communication system operates at a high speed, it may consume a large amount of power due to use of the transistor amplifier. In addition, the bandwidth of the transistor amplifier of the analog communication system needs to be increased to support a fast data transmission speed.

SUMMARY

At least one embodiment of the present disclosure provides a semiconductor device capable of operating at high speed and a communication device comprising the same.

According to an embodiment of the present disclosure, there is provided a semiconductor device including an amplifier configured to amplify a first input signal and a second input signal and output a first output signal and a second output signal. The amplifier includes a first amplification circuit configured to output a first amplification signal and a second amplification signal by first amplifying the first input signal and the second input signal, a second amplification circuit including a first amplification transistor turned on based on the first amplification signal to generate a first output signal, a second amplification transistor turned on based on the second amplification signal to output a second output signal, and a first bias transistor turned on based on a first bias signal to generate the first output signal, a first filter circuit including a first bias capacitor connected to the first amplification transistor and the first bias transistor to generate the first bias signal using a first bias voltage, and a common mode feedback circuit configured to receive the first and second output signals and output a feedback signal that adjusts an average of the first and second output signals to correspond to a reference signal, to the first amplifier. The first filter circuit adjusts a voltage of the first bias capacitor such that a first voltage of the first bias capacitor in a disabled state in which the amplifier does not perform an amplification operation corresponds to a second voltage of the first bias capacitor in an enabled state in which the amplifier performs the amplification operation.

According to an embodiment of the present disclosure, there is provided a semiconductor device comprises a first amplification circuit configured to output a first amplification signal and a second amplification signal by amplifying a first input signal and a second input signal, a second amplification circuit including a first amplification transistor turned on based on the first amplification signal to generate a first output signal, a second amplification transistor turned on based on the second amplification signal to output a second output signal, and a first bias transistor turned on based on a first bias signal to generate the first output signal, a first bias capacitor connected to the first amplification transistor and the first bias transistor, a first switch circuit configured to provide one of a bias voltage and the first amplification signal to one end of the first bias capacitor, and a common mode feedback circuit configured to receive the first and second output signals and output a feedback signal that adjusts an average of the first and second output signals to correspond to a reference signal, to the first amplifier.

According to an embodiment of the present disclosure, there is provided a communication device including a trans-impedance amplifier configured to amplify first and second input signals from a reception mixer, and a reception filter configured to filter an output of the trans-impedance amplifier. The trans-impedance amplifier includes a first amplification circuit configured to output a first amplification signal and a second amplification signal by amplifying the first input signal and the second input signal, a second amplification circuit including a first amplification transistor turned on based on the first amplification signal to generate a first output signal, a second amplification transistor turned on based on the second amplification signal to output a second output signal, and a first bias transistor turned on based on a first bias signal to generate the first output signal, a first filter circuit including a first bias capacitor connected to the first amplification transistor and the first bias transistor and configured to generate the first bias signal using a first bias voltage, and a common mode feedback circuit configured to receive the first and second output signals and output a feedback signal that adjusts an average of the first and second output signals to correspond to a reference signal, to the first amplifier. The first filter circuit adjusts a voltage of the first bias capacitor such that a first voltage of the first bias capacitor in a disabled state in which the amplifier does not perform an amplification operation corresponds to a second voltage of the first bias capacitor in an enabled state in which the amplifier performs the amplification operation.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
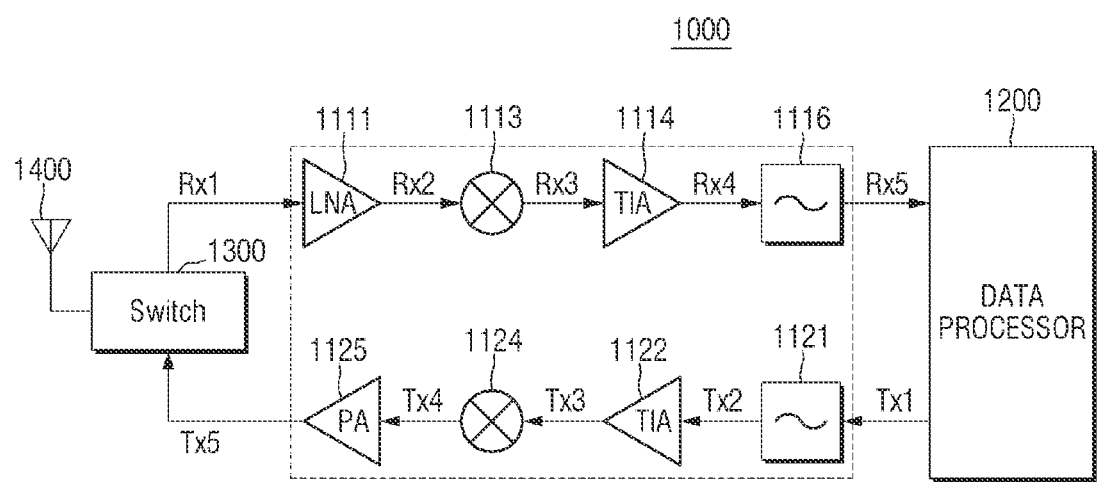
FIG. 1 is a block diagram illustrating a communication device according to an embodiment of the present disclosure.

Hereinafter, embodiments of the present disclosure will be described with reference to the attached drawings:

FIG. 1 is a block diagram illustrating a communication device according to an embodiment of the disclosure.

Referring to FIG. 1, a communication device 1000 may include a transceiver 1100, a data processor 1200, a switch 1300, and an antenna 1400.

The transceiver 1100 may include a low noise amplifier 1111, a reception mixer 1113, a trans-impedance amplifier (TIA) 1114, a reception filter 1116, a transmission filter 1121, a trans-impedance amplifier 1122, a transmission mixer 1124, and a power amplifier 1125.

In a reception mode, the switch 1300 may output a first reception signal Rx1 received via the antenna 1400 to the low noise amplifier 1111. The low noise amplifier 1111 may amplify the first reception signal Rx1 to generate a second reception signal Rx2. The reception mixer 1113 may generate a third reception signal Rx3 by performing down-converting for the second reception signal Rx2. For example, the reception mixer 1113 may perform a down-converting operation on the second reception signal Rx2 to convert the second reception signal Rx2 into a lower frequency signal to generate the third reception signal Rx3.

The trans-impedance amplifier 1114 may generate a fourth reception signal Rx4 by amplifying the third reception signal Rx3. In an embodiment, the reception filter 1116 generates a fifth reception signal Rx5 by filtering the fourth reception signal Rx4, and may output the same signal to the data processor 1200.

In an embodiment, the trans-impedance amplifier 1114 and the reception filter 1116 act to convert and filter a radio frequency (RF) current signal down-converted via the reception mixer 1113 into an intermediate frequency (IF) voltage signal.

In a transmission mode, the data processor 1200 may generate a first transmission signal Tx1 and output the same signal to the transceiver 1100. The transmission filter 1121 may generate a second transmission signal Tx2 by filtering the first transmission signal Tx1, and the trans-impedance amplifier 1122 may generate a third transmission signal Tx3 by amplifying the second transmission signal Tx2. In an embodiment, the trans-impedance amplifier 1122 includes a trans-impedance amplifier.

The transmission mixer 1124 may generate a fourth transmission signal Tx4 by performing up-converting on the third transmission signal Tx3, and the power amplifier 1125 may amplify the fourth transmission signal Tx4 to generate a fifth transmission signal Tx5. For example, the transmission mixer 1124 may perform an up-converting operation on the third transmission signal Tx3 to convert the third transmission signal Tx3 into a higher frequency signal to generate the fourth transmission signal Tx4. The switch 1300 may connect the power amplifier 1125 to the antenna 1400, and the fifth transmission signal Tx5 may be output to the outside via the antenna 1400.

Figure 2:
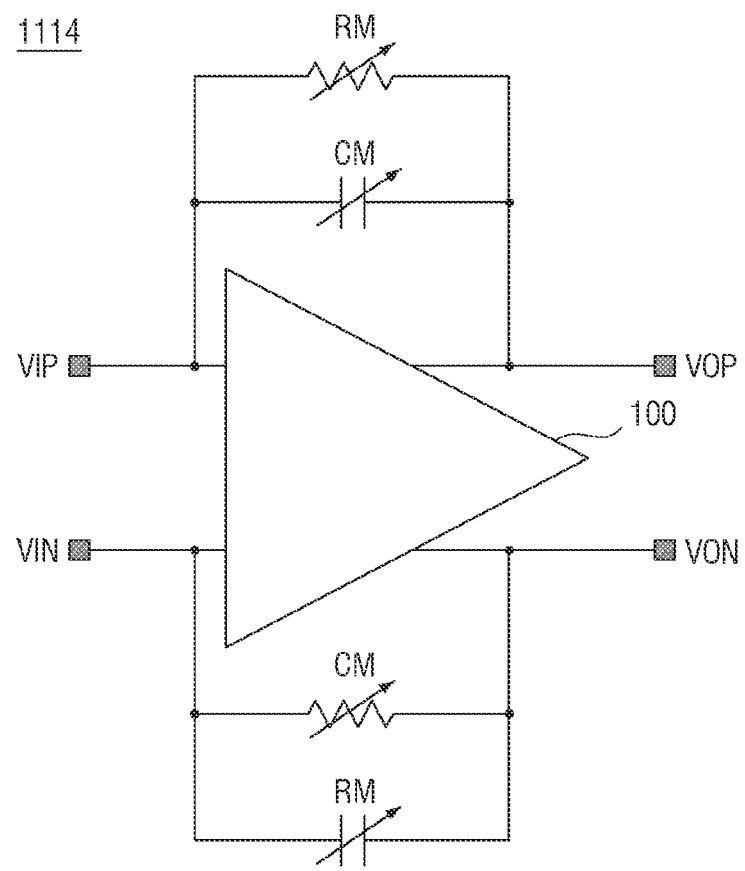
FIG. 2 is a circuit diagram illustrating a trans-impedance amplifier in FIG. 1.

FIG. 2 is a circuit diagram illustrating the trans-impedance amplifier 1114 in FIG. 1 according to an exemplary embodiment.

Referring to FIG. 2, the trans-impedance amplifier 1114 may include an amplifier 100 configured to receive input signals VIP and VIN, a feedback resistor RM and a feedback capacitor CM connected in parallel to an input terminal and an output terminal of the amplifier 100.

Even though the configuration of the trans-impedance amplifier 1114 in FIG. 1 will be described herein, the trans-impedance amplifier 1122 in FIG. 1 may also include the same configuration as the configuration to be described below.

The input signals VIP and VIN provided to the amplifier 100 may be amplified by the amplifier 100 and may be output as output signals VOP and VON. In some embodiments, the input signals VIP and VIN may be, for example, differential signals, but the present embodiments are not limited thereto. In addition, the amplifier 100 may include an operational transmission amplifier (OTA), but the present embodiments are not limited thereto.

The feedback resistor RM and the feedback capacitor CM may include, for example, a variable resistor and a variable capacitor. A gain and a cutoff frequency of the trans-impedance amplifier 1114 may vary by changing a resistance level of the feedback resistor RM and/or a capacitance level of the feedback capacitor CM. For example, an additional control circuit may be present to provide a first control signal to the variable resistor to change its resistance and/or provide a second control signal to the variable capacitor to change its capacitance.

For example, the cutoff frequency of the trans-impedance amplifier 1114 may have characteristics that are inversely proportional to the resistance level of the feedback resistor RM and the capacitance level of the feedback capacitor CM.

That is, when the resistance level of the feedback resistor RM and the capacitance level of the feedback capacitor CM increase, the cutoff frequency of the trans-impedance amplifier 1114 decreases, and accordingly, the transimpedance amplifier 1114 may operate as a narrowband filter that passes an input signal with a low frequency. The narrowband filter may pass frequencies within a certain first range and reject (or attenuate) frequencies outside the first range.

In addition, when the resistance level of the feedback resistor RM and the capacitance level of the feedback capacitor CM decrease, the cutoff frequency of the trans-impedance amplifier 1114 increases, and accordingly, the trans-impedance amplifier 1114 may operate as a wideband filter that passes the input signal having a high frequency. The wideband filter may pass frequencies within a certain second range and reject (or attenuate) frequencies outside the second range, where the second range is larger than the first range.

In some embodiments, the feedback resistor RM and the feedback capacitor CM may be controlled by a digital code and be set to increase or decrease either linearly or exponentially. For example, the digital code may indicate a particular resistance value to set the feedback resistor RM or a particular capacitance level to set the feedback capacitor CM.

Figure 3:
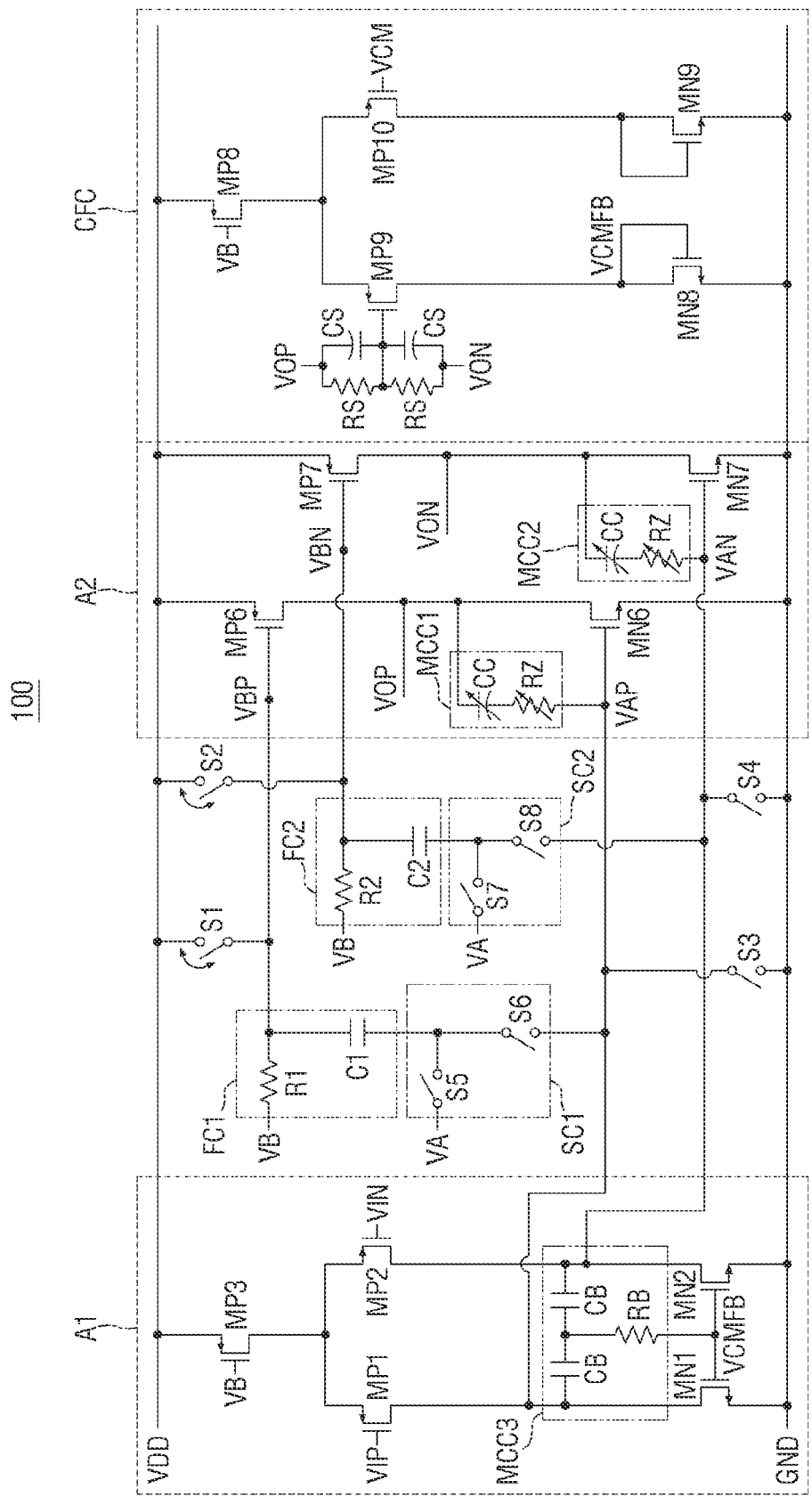
FIG. 3 is a circuit diagram of the amplifier in FIG. 2.

FIG. 3 is a circuit diagram of the amplifier 100 in FIG. 2 according to an embodiment of the present disclosure.

Referring to FIG. 3, the amplifier 100 may include a first amplifier A1 (e.g., first amplifier circuit), a second amplifier A2 (e.g., a second amplifier circuit), a common mode feedback circuit CFC, filter circuits FC1 and FC2, and switch circuits SC1 and SC2.

The first amplifier A1 may first amplify a first input signal VIP and a second input signal VIN to output a first amplification signal VAP and a second amplification signal VAN.

The first amplifier A1 may include a bias transistor MP3 turned on based on a bias voltage VB, a transistor MP1 turned on based on the first input signal VIP, a transistor MP2 turned on based on the second input signal VIN, and transistors MN1 and MN2 turned on based on a feedback signal VCMFB. For example, the bias voltage VB may be applied to a gate of the bias transistor MP3, the first input signal VIP may be applied to a gate of transistor MP1, the second input signal VIN may be applied to a gate of transistor MP2, and the feedback signal VCMFB may be applied to gates of the transistors MN1 and MN2.

A source end of the bias transistor MP3 may be connected to a node receiving a power supply voltage VDD, and a drain end of the bias transistor MP3 may be connected to a source end of the transistor MP1 and the transistor MP2. The bias voltage VB may be provided to a gate end (e.g., a gate or gate terminal) of the bias transistor MP3. The power supply voltage VDD may provide power to the amplifier 100. The bias voltage VB may be generated by applying the power supply voltage VDD to first and second resistors. For example, the first and second transistor may form a voltage divider. In an embodiment, a magnitude of the bias voltage VB is smaller than a magnitude of the power supply voltage VDD and is larger than the magnitude of a ground voltage.

The first input signal VIP may be provided to a gate end of the transistor MP1, and a drain end (e.g., a drain or drain terminal) of the transistor MP1 may be connected to the drain end of the transistor MN1. The second input signal VIN may be provided to a gate end of the transistor MP2, and a drain end of the transistor MP2 may be connected to a drain end of the transistor MN2.

The feedback signal VCMFB may be provided to a gate end of the transistor MN1, and a source end (e.g., a source or source terminal) of the transistor MN1 may be grounded. The feedback signal VCMFB may be provided to a gate end of the transistor MN2, and a source end of the transistor MN2 may be grounded.

In some embodiments, the bias transistor MP3 and the transistors MP1 and MP2 may include a P-type transistor, and the transistors MN1 and MN2 may include an N-type transistor, but the present embodiment is not limited thereto.

The first input signal VIP may be first amplified by a bias current generated by turning on the transistor MP1 based on the first input signal VIP and turning on the transistor MN1 based on the feedback signal VCMFB, thus generating the first amplification signal VAP. Then, the generated first amplification signal VAP may be transmitted to a second amplifier A2 (e.g., a gate end of a transistor MN6).

The second input signal VIN may be first amplified by a bias current generated by turning on the transistor MP2 based on the second input signal VIN and turning on the transistor MN2 based on the feedback signal VCMFB, thus generating the second amplification signal VAN. Then, the generated second amplification signal VAN may be transmitted to the second amplifier A2 (e.g., a gate end of a transistor MN7).

In some embodiments, the first amplifier A1 may include a miller compensation circuit MCC3 including a resistor RB and a capacitor CB.

The miller compensation circuit MCC3 may be connected between the gate ends and the drain ends of the transistors MN1 and MN2 to perform a compensation operation.

The second amplifier A2 may second amplify the first amplification signal VAP and the second amplification signal VAN to output a first output signal VOP and a second output signal VON.

The second amplifier A2 may include a bias transistor MP6 turned on based on a first bias signal VBP, a bias transistor MP7 turned on based on a second bias signal VBN, an amplification transistor MN6 turned on based on the first amplification signal VAP output from the first amplifier A1, and an amplification transistor MN7 turned on based on the second amplification signal VAN output from the first amplifier A1. The first bias signal VBP may be applied to a gate of the bias transistor MP6, the second bias signal VBN may be applied to a gate of the bias transistor MP7, the first amplification signal VAP may be applied to a gate of the amplification transistor MN6, and the second amplification signal VAN may be applied to a gate of the amplification transistor MN7. In an embodiment, the first bias signal VBP is an inverse of the second bias signal VBN.

The first output signal VOP may be generated by adding a bias current generated by the bias transistor MP6 to a current generated by the amplification transistor MN6. That is, the first output signal VOP may be generated by the current generated by the amplification transistor MN6 and the bias transistor MP6.

The second output signal VON may be generated by adding the bias current generated by the bias transistor MP7 to a current generated by the amplification transistor MN7. That is, the second output signal VON may be generated by the current generated by the amplification transistor MN7 and the bias transistor MP7.

A source end of the bias transistor MP6 may be connected to the power supply voltage VDD, and a drain end of the bias transistor MP6 may be connected to a drain end of the amplification transistor MN6. The gate end of the bias transistor MP6 may be connected to a filter circuit FC1.

A source end of the bias transistor MP7 may be connected to the power supply voltage VDD, and a drain end of the bias transistor MP7 may be connected to a drain end of the amplification transistor MN7. The gate end of the bias transistor MP7 may be connected to a filter circuit FC2.

A source end of the amplification transistor MN6 may be grounded, and a drain end of the amplification transistor MN6 may be connected to the drain end of the bias transistor MP6. The first output signal VOP may be output to the drain end of the amplification transistor MN6. A gate end of the amplification transistor MN6 may be connected to the drain end of the transistor MP1 of the first amplifier A1 and the drain end of the transistor MN1. The gate end of the amplification transistor MN6 may be connected to the filter circuit FC1 through a switch circuit SC1.

A source end of the amplification transistor MN7 may be grounded, and a drain end of the amplification transistor MN7 may be connected to the drain end of the bias transistor MP7. The second output signal VON may be output to a drain end of the amplification transistor MN7. A gate end of the amplification transistor MN7 may be connected to the drain end of the transistor MP2 and the drain end of the transistor MN2 of the first amplifier A1. The gate end of the amplification transistor MN7 may be connected to the filter circuit FC2 through a switch circuit SC2.

In some embodiments, bias transistors MP7 and MP6 may include the P-type transistor, and the amplification transistors MN7 and MN6 may include the N-type transistor, but the present embodiment is not limited thereto.

In some embodiments, the second amplifier A2 may include a first miller compensation circuit MCC1 and a second miller compensation circuit MCC2 including a variable resistor RZ and a variable capacitor CC.

The first miller compensation circuit MCC1 may be connected between the gate end and the drain end of the transistor MN6 to perform a compensation operation. The second miller compensation circuit MCC2 may be connected between the gate end and the drain end of the transistor MN7 to perform a compensation operation.

In some embodiments, the amplifier 100 may include a common mode feedback circuit CFC and first and second miller compensation circuits MCC1 and MCC2 that perform dominant pole compensation using a miller effect.

The common mode feedback circuit CFC may receive the first output signal VOP and the second output signal VON, and may output the feedback signal VCMFB that adjusts an average of the first output signal VOP and the second output signal VON to correspond to a reference signal VCM.

In the amplifier 100, when there is no difference between the first input signal VIP and the second input signal VIN, which are differential signals, the first output signal VOP and the second output signal VON of the amplifier 100 should be disposed at an intermediate level of an overall voltage swing. However, due to changes in power, temperature and process, and a gap between an input common mode and an output common mode of the amplifier 100, or changes in the output common mode caused by noise, an output of the amplifier 100 may be biased to a level other than an intermediate level, leading to restriction in the operation of the amplifier 100.

A common mode feedback circuit CFC may be used to prevent the output from being biased a level other than the *intermedia* level. The common mode feedback circuit CFC is a negative feedback circuit that detects a common mode voltage of the amplifier 100, compares the detected common mode voltage with a reference voltage, and makes the detected common mode voltage close to the reference voltage according to the comparison results.

The common mode feedback circuit CFC may be used in an output terminal of the amplifier 100 to set a common mode of differential output signals.

The common mode feedback circuit CFC may include a bias transistor MP8 turned on based on the bias voltage VB, a transistor MP9 turned on based on an average of the first output signal VOP and the second output signal VON, a transistor MP10 turned on based on the reference signal VCM, and a transistor MN8 turned on by an output of a drain end of the transistor MP9, and a transistor MN9 may be turned on by an output of a drain end of the transistor MP10.

A source end of the bias transistor MP8 may be connected to the power supply voltage VDD, and a drain end of the bias transistor MP8 may be connected to source ends of the transistor MP9 and the transistor MP10. The bias voltage VB may be provided to a gate end of the bias transistor MP8.

An average of the first output signal VOP and the second output signal VON may be provided to a gate end of the transistor MP9 by resistors RS and capacitors CS. The drain end of the transistor MP9 may be connected to a drain end of the transistor MN8. The reference signal VCM may be provided to a gate end of the transistor MP10, and the drain end of the transistor MP10 may be connected to a drain end of the transistor MN9.

A gate end of the transistor MN8 may be connected to the drain end of the transistor MN8, and the feedback signal VCMFB may be output via the drain end of the transistor MN8. A source end of the transistor MN8 may be grounded. A gate end of the transistor MN9 may be connected to the drain end of the transistor MN8, and a source end of the transistor MN9 may be grounded.

In some embodiments, the bias transistor MP8 and the transistors MP9 and MP10 may include the P-type transistor, and the transistors MN8 and MN9 may include the N-type transistor, but the present embodiment is not limited thereto.

The transistors MP9, MP10, MN8, and MN9 may generate the feedback signal VCMFB for adjusting the average of the first output signal VOP and the second output signal VON to correspond to the reference signal VCM. The generated feedback signal VCMFB may be provided to the first amplifier A1. For example, the generated feedback signal VCMFB may be provided to gate ends of the transistors MN1 and MN2 of the first amplifier A1.

The filter circuit FC1 may include a resistor R1 and a bias capacitor C1. In some embodiments, the filter circuit FC1 may be a high pass filter including the resistor R1 and the bias capacitor C1. The filter circuit FC1 may generate the first bias signal VBP by using the resistor R1 and the bias capacitor C1. The high pass filter passes signals with a frequency higher than a certain cutoff frequency and attenuates signals with frequencies lower than the cutoff frequency.

One end of the resistor R1 may be provided with the bias voltage VB (e.g., a first bias voltage), and the other end of the resistor R1 may be connected to the bias capacitor C1. Since the bias capacitor C1 is used such that the bias transistor MP6 of the second amplifier A2 generates an additional bias current, the bias capacitor C1 may be referred to as a current reuse capacitor. In addition, since the bias capacitor C1 is used such that the bias transistor MP6 of the second amplifier A2 generates an additional gain, the bias capacitor C1 may be referred to as a gain boosting capacitor.

One end of the bias capacitor C1 may be connected to the switch circuit SC1, and the other end of the bias capacitor C1 may be connected to the resistor R1.

The switch circuit SC1 may control one of a bias voltage VA (e.g., a second bias voltage) and the first amplification signal VAP to be provided to one end of the bias capacitor C1. That is, the switch circuit SC1 may connect one end of the bias capacitor C1 to either the bias voltage VA or the gate end of the amplification transistor MN6 of the second amplifier A2.

In an embodiment, the bias voltage VA is a voltage different from the bias voltage VB. For example, the magnitude of the bias voltage VA may be greater than the magnitude of a ground voltage GND and less than the magnitude of the power supply voltage VDD, and may be simultaneously different from the magnitude of the bias voltage VB.

In some embodiments, the bias voltage VA may be such that a voltage of the bias capacitor C1 in a disabled state in which the amplifier 100 fails to perform an amplification operation corresponds to the voltage of the bias capacitor C1 in an enabled state in which the amplifier 100 performs the amplification operation. For example, the magnitude of the bias voltage VA may be determined such that a voltage difference between opposite ends of the bias capacitor C1 when the amplifier 100 is in the disabled state is substantially the same as the voltage difference between opposite ends of the bias capacitor C1 when the amplifier 100 is in the enabled state.

For example, when the power supply voltage VDD is 1.2V, in the enabled state in which the amplifier 100 performs the amplification operation, the first bias signal VBP may be 0.8V and the first amplification signal VAP may be 0.4V according to characteristics of transistors or passive elements included in the amplifier 100. In this case, the voltage difference between opposite ends of the bias capacitor C1 in the enabled state of the amplifier 100 is 0.4 V.

Accordingly, in this case, the bias voltage VA may be determined to be 0.8 V. When the bias voltage VA is determined to be 0.8V, in the disabled state in which the amplifier 100 fails to perform the amplification operation, 1.2V of the power supply voltage VDD is applied to one end of the bias capacitor C1, and 0.8V of the bias voltage VA is applied to the other end of the bias capacitor C1, and accordingly, in the disabled state of the amplifier 100, the voltage difference between opposite ends of the bias capacitor C1 may be 0.4 V. This will be described in more detail later.

In some embodiments, a switch circuit FC1 may include a switch S5 and a switch S6. The switch S5 may control whether the bias voltage VA is connected to the bias capacitor C1, and the switch S6 may control whether the gate end of the amplification transistor MN6 is connected to the bias capacitor C1.

The filter circuit FC2 may include a resistor R2 and a bias capacitor C2. In an embodiment, the filter circuit FC2 is a high pass filter including the resistor R2 and the bias capacitor C2. The filter circuit FC2 may generate the second bias signal VBN by using the resistor R2 and the bias capacitor C2.

The bias voltage VB may be provided to one end of the resistor R2, and the other end of the resistor R2 may be connected to the bias capacitor C2. The bias capacitor C2 may be referred to as the current reuse capacitor or the gain boosting capacitor as described above.

One end of the bias capacitor C2 may be connected to the switch circuit SC2, and the other end of the bias capacitor C2 may be connected to the resistor R2.

The switch circuit SC2 may control one of the bias voltage VA and the second amplification signal VAN to be provided to one end of the bias capacitor C2. That is, the switch circuit SC2 may connect one end of the bias capacitor C2 to either the bias voltage VA or the gate end of the amplification transistor MN7 of the second amplifier A2.

In some embodiments, the switch circuit FC2 may include a switch S7 and a switch S8. The switch S7 may control whether the bias voltage VA is connected to the bias capacitor C2, and the switch S8 may control whether the gate end of the amplification transistor MN7 is connected to the bias capacitor C2.

The switch S1 may control whether the power supply voltage VDD is applied to the gate end of the bias transistor MP6. When the amplifier 100 is in the disabled state, the switch S1 may be turned on to provide the power supply voltage VDD to the gate end of the bias transistor MP6, and when the amplifier 100 is in the enabled state, the switch S1 may be turned off.

The switch S3 may control whether the ground voltage GND is applied to the gate end of the amplification transistor MN6. When the amplifier 100 is in the disabled state, the switch S3 may be turned on to provide the ground voltage GND to the gate end of the amplification transistor MN6, and when the amplifier 100 is in the enabled state, the switch S3 may be turned off.

The switch S2 may control whether the power supply voltage VDD is applied to the gate end of the bias transistor MP7. When the amplifier 100 is in the disabled state, the switch S2 may be turned on to provide the power supply voltage VDD to the gate end of the bias transistor MP6, and when the amplifier 100 is in the enabled state, the switch S2 may be turned off.

The switch S4 may control whether the ground voltage GND is applied to the gate end of the amplification transistor MN7. When the amplifier 100 is in the disabled state, the switch S4 is turned on to provide the ground voltage GND to the gate end of the amplification transistor MN7, and when the amplifier 100 is in the enabled state, the switch S4 may be turned off.

Figure 4:
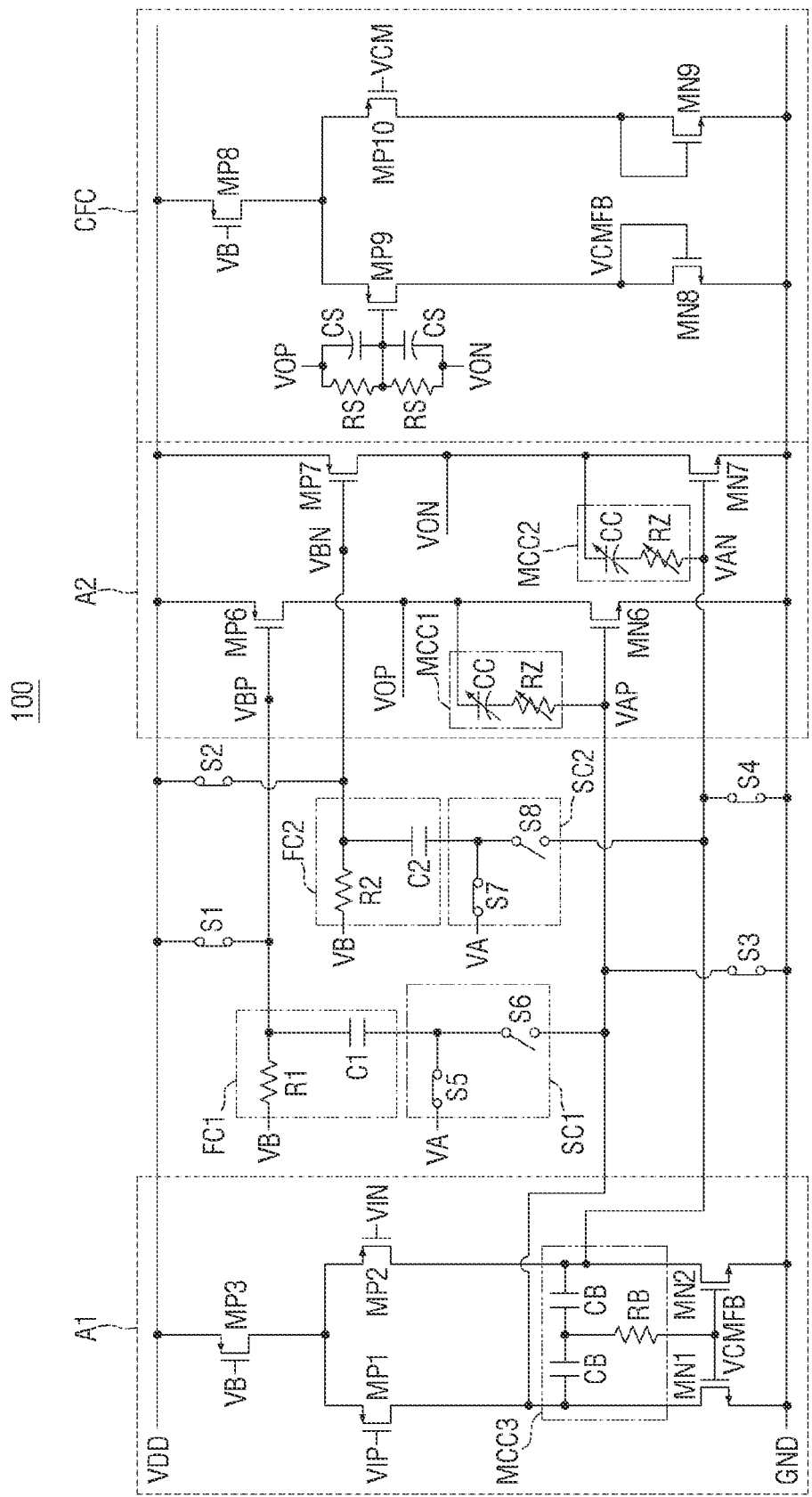
FIGS. 4 and 5 are diagrams explaining an operation of the amplifier according to an embodiment of the present disclosure.
Figure 5:
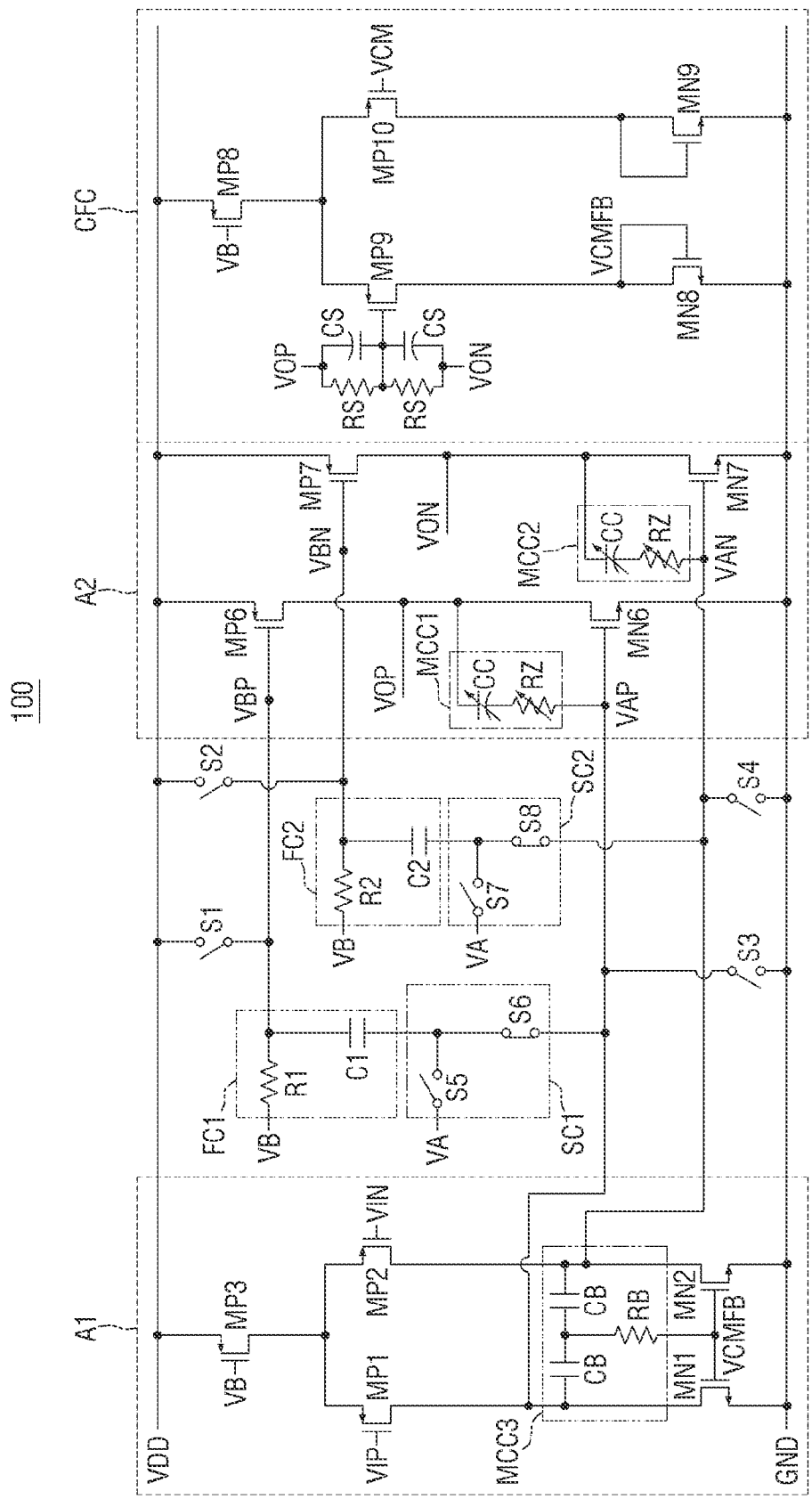

FIGS. 4 and 5 are diagrams explaining an operation of the trans-impedance amplifier according to an embodiment. FIG. 4 is a circuit diagram with the amplifier in the disabled state, and FIG. 5 is a circuit diagram with the amplifier in the enabled state.

First, referring to FIG. 4, when the amplifier 100 is the disabled state, the switches S1, S2, S3, S4, S5 and S7 are turned on, and the switches S6 and S8 are turned off.

Accordingly, a voltage difference between opposite ends of the bias capacitor C1 and the bias capacitor C2 becomes VDD−VA.

Next, referring to FIG. 5, when the amplifier 100 is in the enabled state, the switches S6 and S8 are turned on, and the switches S1, S2, S3, S4, S5, and S7 are turned off.

Accordingly, the voltage difference between opposite ends of the bias capacitor C1 becomes VBP−VAP, and the voltage difference between opposite ends of the bias capacitor C2 becomes VBN−VAN. Herein, the magnitudes of the first and second bias signals VBP and VBN and the first and second amplification signals VAP and VAN may vary according to design characteristics of elements included in the amplifier 100. In the present embodiment, the magnitude of the bias voltage VA may be determined to satisfy Equation 1 below.

$$VDD-VA=VBP(VBN)-VAP(VAN) \qquad \text{[Equation 1]}$$

The magnitude of the bias voltage VA is set as described above. When the switch circuits SC1 and SC2 are controlled as illustrated in FIG. 4 in the disabled state of the amplifier 100, and the switch circuits SC1 and SC2 are controlled as illustrated in FIG. 5 in the enabled state of the amplifier 100, even if a capacitance of the bias capacitors C1 and C2 is designed to be large, a high-speed operation may be performed without decreasing the start-up time of the amplifier 100.

Hereinafter, this will be described in more detail with reference to FIGS. 6 to 8.

Figure 6:
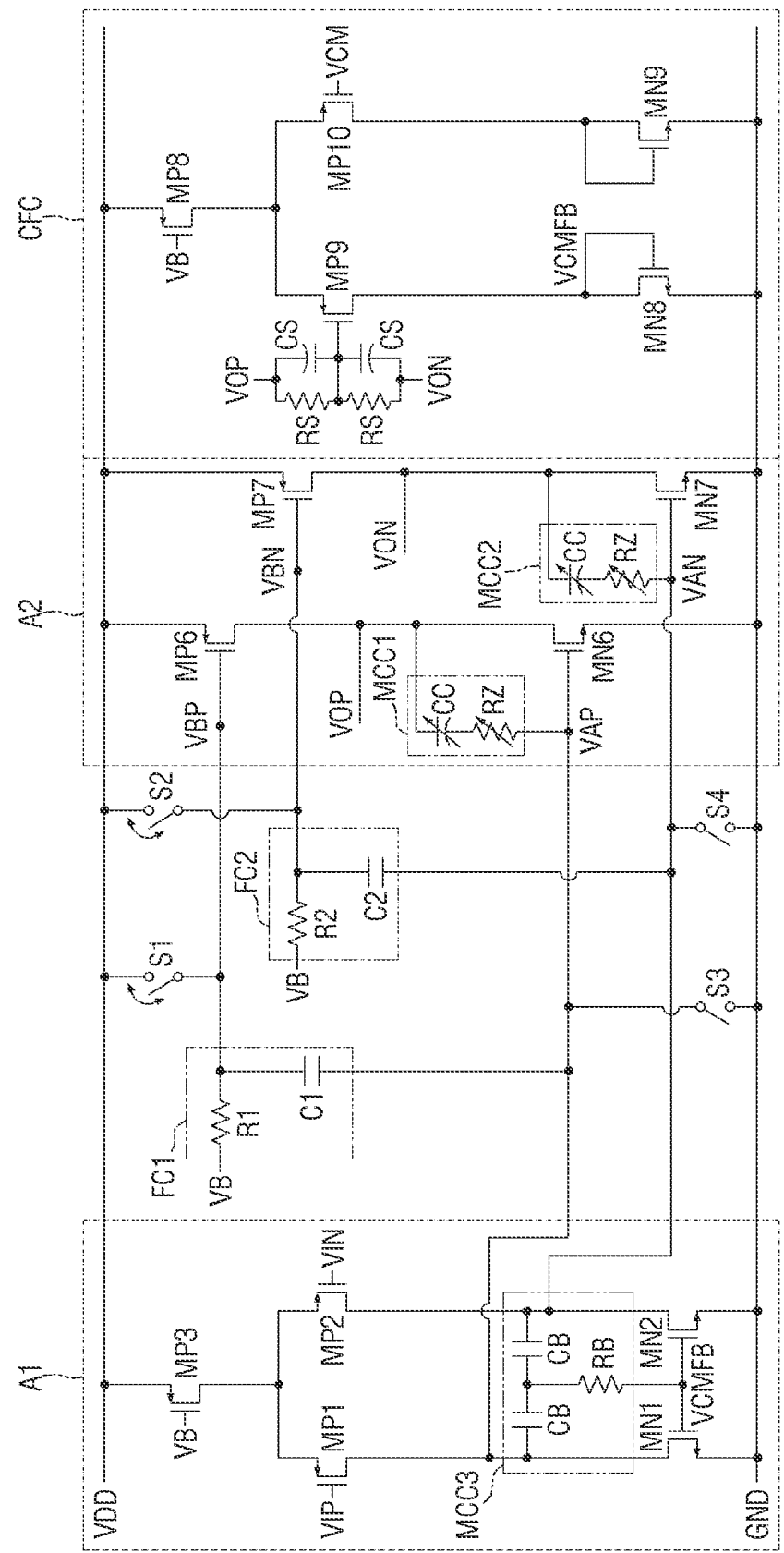
FIGS. 6 to 8 are diagrams explaining an effect of the trans-impedance amplifier according to an embodiment of the present disclosure.
Figure 7:
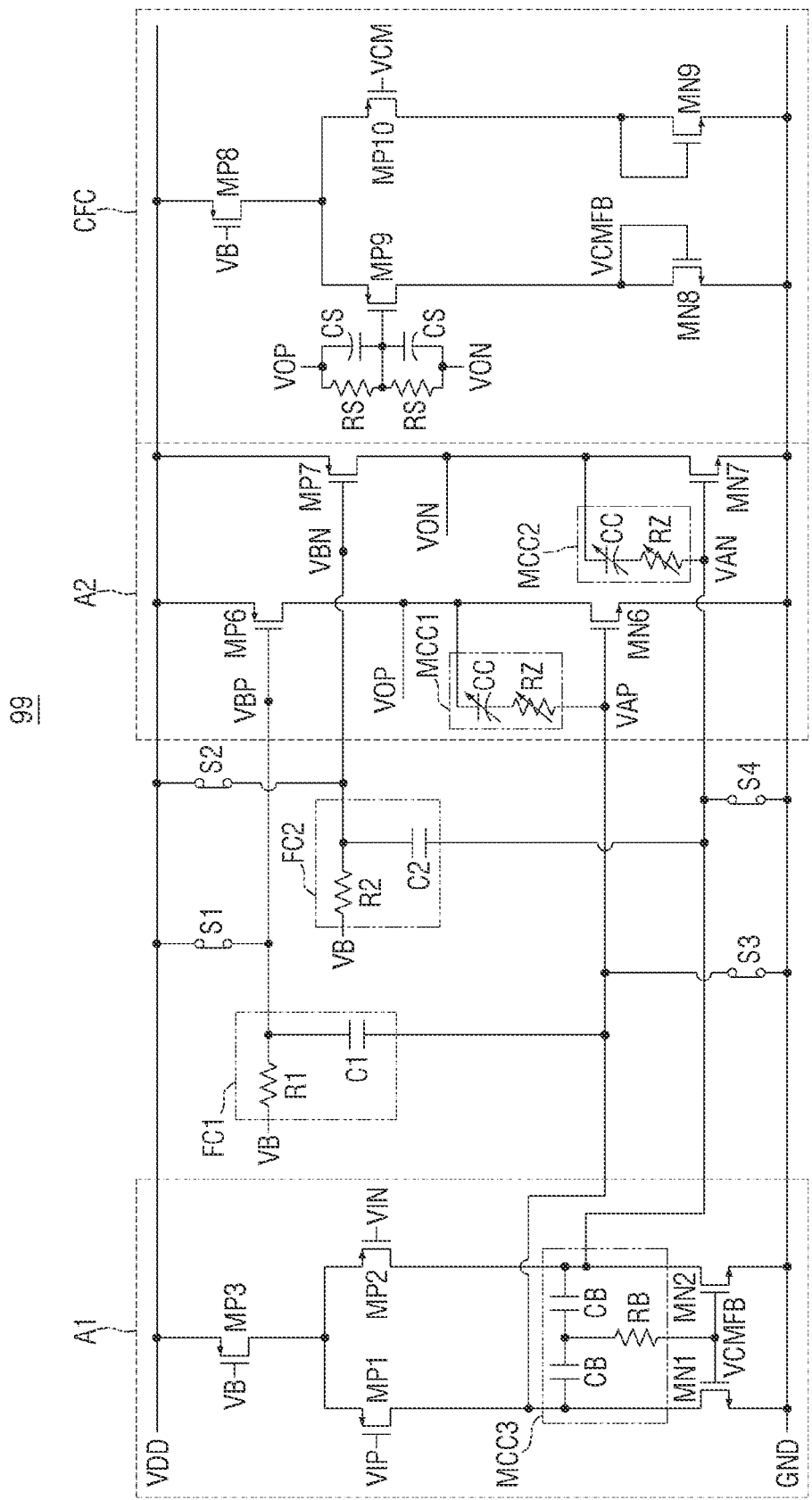
Figure 8:
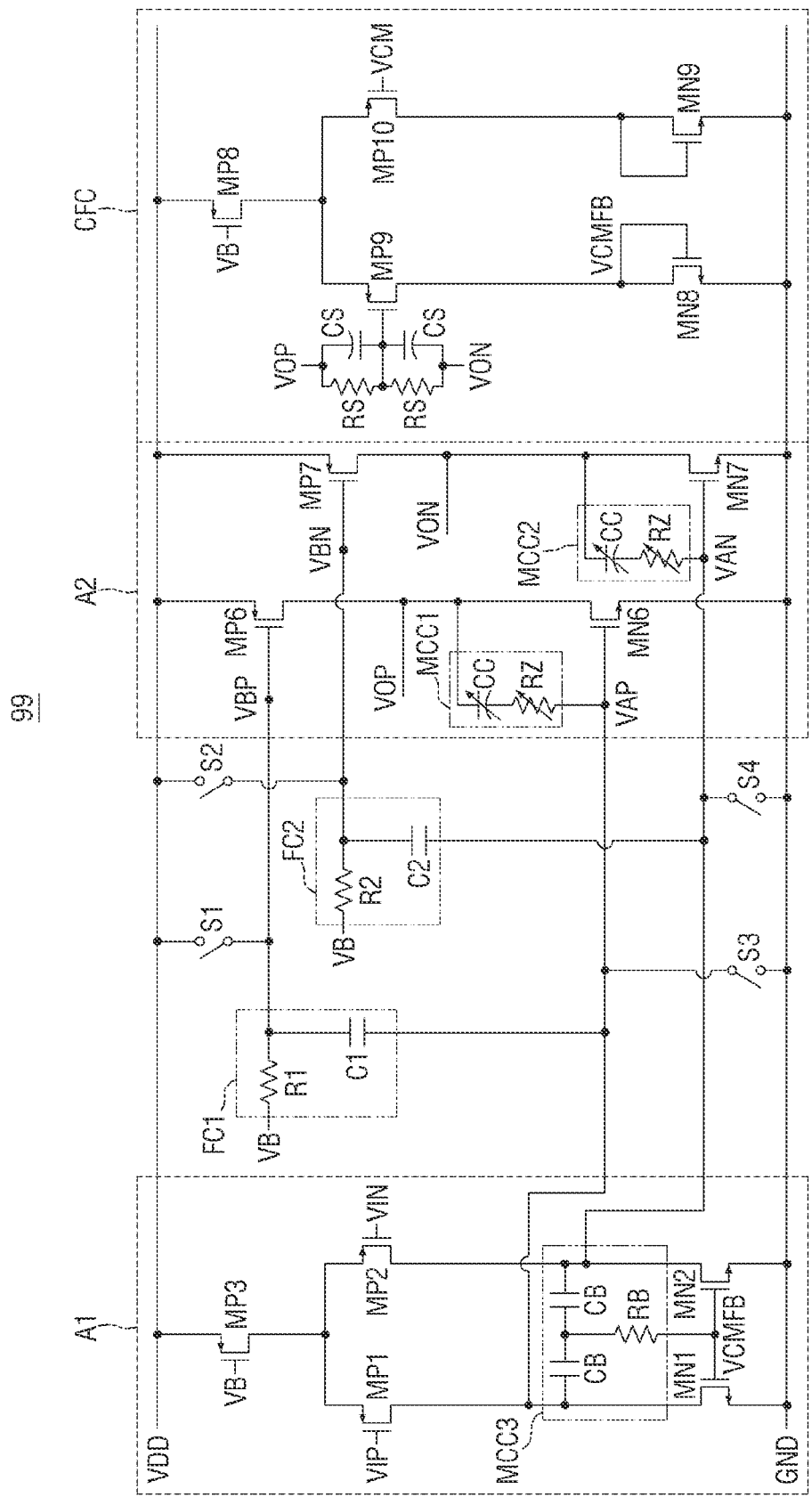

FIGS. 6 to 8 are diagrams explaining an effect of the trans-impedance amplifier according to an embodiment.

FIG. 6 is a circuit diagram of an amplifier 99 with a configuration different from that of the amplifier 100 described above (see FIG. 3). FIG. 7 is a circuit diagram when the amplifier in FIG. 6 is in the disabled state, and FIG. 8 is a circuit diagram when the amplifier in FIG. 6 is in the enabled state.

Referring to FIG. 6, unlike the amplifier 100 described above (see FIG. 3), the amplifier 99 does not include the switch circuits SC1 and SC2 in FIG. 3.

Since the filter circuits FC1 and FC2 are high-pass filters, the cutoff frequency of the high-pass filter is determined by 1/RC. Accordingly, with the increase in capacitance values of the bias capacitors C1 and C2, filter linearity of the filter circuits FC1 and FC2 may improve even at low frequencies. Accordingly, in order to increase the performance of the filter circuits FC1 and FC2, capacitance values of the bias capacitors C1 and C2 may need to be large.

However, when the capacitance values of the bias capacitors C1 and C2 are large, a change in the charge amount of the bias capacitors C1 and C2 increases when the amplifier 99 is switched from the disabled state to the enabled state.

For example, when the amplifier 99 is in the disabled state as illustrated in FIG. 7, the voltages of the bias capacitors C1 and C2 are VDD−GND (e.g., 1.2V−0V=1.2V), or when the amplifier 99 is in the enabled state as illustrated in FIG. 8, the voltages of the bias capacitors C1 and C2 are changed to VBP (VBN)–VAP (VAN) (e.g., 0.8V–0.4V=0.4V). Such voltage change is a factor that increases the start-up time of the amplifier 99 and slows the operation speed of the amplifier 99.

However, when the amplifier 100 according to the present embodiment described above is in the disabled state, the voltages of the bias capacitors C1 and C2 are VDD–VA (for example, 1.2V–0.8V=0.4V) by the switch circuits SC1 and SC2. In addition, when the amplifier 100 according to the present embodiment described above is in the enabled state, the voltages of the bias capacitors C1 and C2 are VBP (VBN)–VAP (for example, 0.8V–0.4V=0.4V).

That is, when the amplifier 100 is in the disabled state, the voltages of the bias capacitors C1 and C2 are previously adjusted (for example, charged) by the voltages of the bias capacitors C1 and C2 in the enabled state, thereby minimizing the amount of change in charge of the bias capacitors C1 and C2 when the amplifier 100 is switched from the disabled state to the enabled state.

Accordingly, even if the capacitance values of the bias capacitors C1 and C2 are designed to be large to increase performance of the filter circuits FC1 and FC2, the start-up time of the amplifier 100 is not increased, and accordingly, a high-speed operation may be performed due to the short start-up time.

Figure 9:
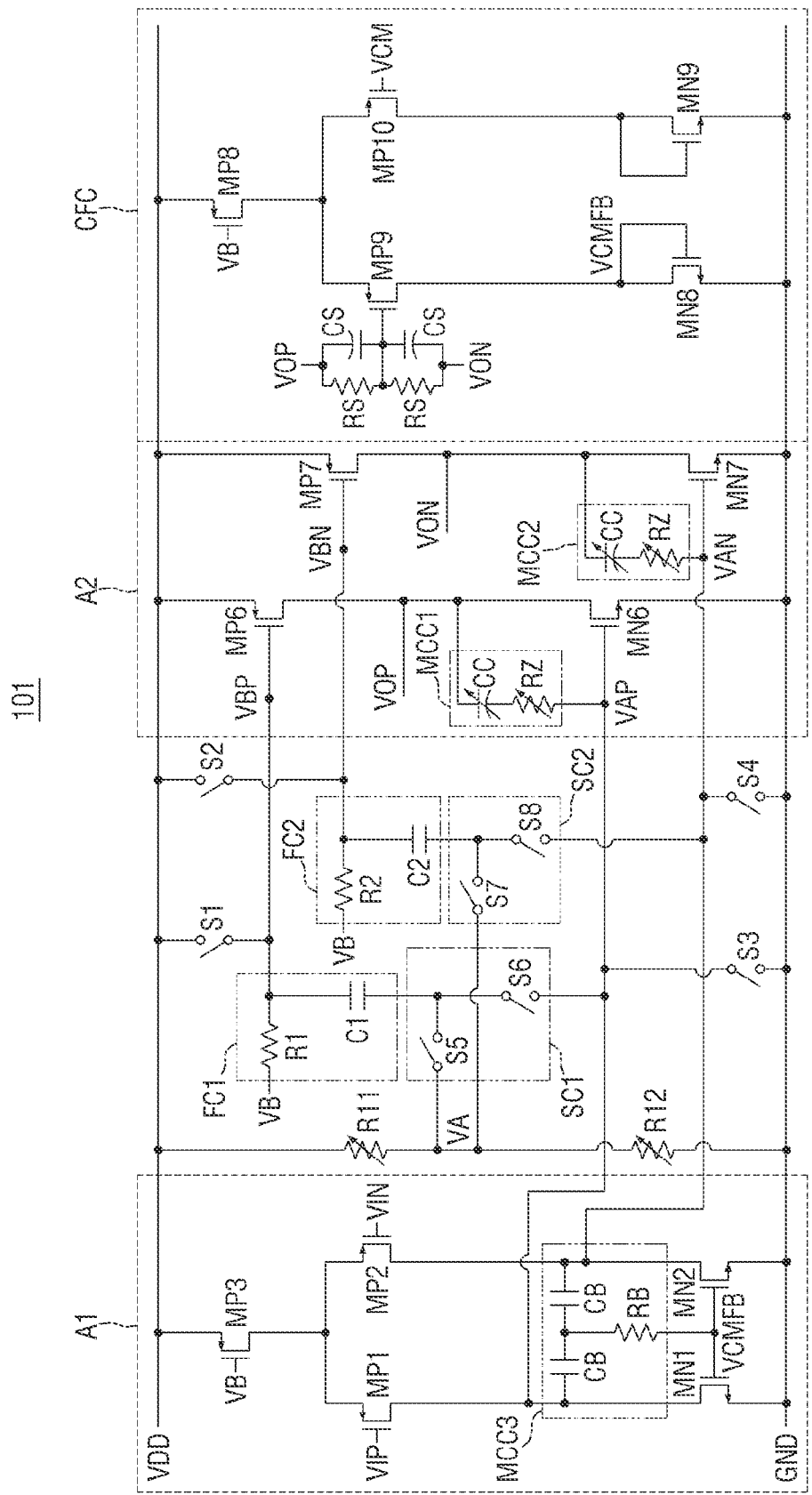
FIG. 9 is a circuit diagram of an amplifier according to an embodiment of the present disclosure.

FIG. 9 is a circuit diagram of an amplifier according to an embodiment of the disclosure.

Hereinafter, an explanation similar to that of the above-described embodiments will be omitted and differences will be mainly described. For example, the circuit in FIG. 9 is similar to the circuit shown in FIG. 6.

Referring to FIG. 9, an amplifier 101 may further include variable resistors R11 and R22 disposed between the power supply voltage VDD and the ground voltage GND.

In the present embodiment, the variable resistors R11 and R22 may be distribution resistors for generating the bias voltage VA. That is, the bias voltage VA may be generated by resistance values of the variable resistors R11 and R22.

For example, when the magnitude of the power supply voltage VDD is 1.2V and the magnitude of the bias voltage VA is 0.8V, the ratio between the resistance value of the variable resistor R11 and the resistance value of the variable resistor R12 may be 1:2. A control circuit may be present providing control signals to the variable resistor R11 and the variable resistor R12 to set their resistance values to achieve the desired ratio such as 1:2.

Since the operations of the switch circuits SC1 and SC2 when the amplifier 101 operates in the disabled state and when the amplifier 101 operates in the enabled state are the same as those described above, redundant descriptions thereof will be omitted.

Exemplary embodiments of the present disclosure have been described hereinabove with reference to the accompanying drawings, but the present disclosure is not limited to the above-described exemplary embodiments, and may be implemented in various different forms. For example, one of ordinary skill in the art to which the present disclosure pertains may understand that the present disclosure may be implemented in other specific forms without changing the technical spirit of the present disclosure.

What is claimed is:

1. A semiconductor device, comprising:
    an amplifier configured to amplify a first input signal and a second input signal and output a first output signal and a second output signal,
    wherein the amplifier comprises:
        a first amplification circuit configured to output a first amplification signal and a second amplification signal by amplifying the first input signal and the second input signal;
        a second amplification circuit including a first amplification transistor turned on based on the first amplification signal to generate a first output signal, a second amplification transistor turned on based on the second amplification signal to output a second output signal, and a first bias transistor turned on based on a first bias signal to generate the first output signal;
        a first filter circuit including a first bias capacitor connected to the first amplification transistor and the first bias transistor to generate the first bias signal using a first bias voltage; and
        a common mode feedback circuit configured to receive the first and second output signals and output a feedback signal that adjusts an average of the first and second output signals to correspond to a reference signal, to the first amplifier,
    wherein the first filter circuit adjusts a voltage of the first bias capacitor such that a first voltage of the first bias capacitor in a disabled state in which the amplifier does not perform an amplification operation corresponds to a second voltage of the first bias capacitor in an enabled state in which the amplifier performs the amplification operation.

2. The semiconductor device of claim 1, wherein the first bias capacitor is connected to a gate of the first amplification transistor and a gate of the first bias transistor.

3. The semiconductor device of claim 2, wherein the first filter circuit includes a resistor having one end provided with the first bias voltage and the other end connected to one end of the first bias capacitor and the gate of the first bias transistor.

4. The semiconductor device of claim 2, wherein the second amplification circuit further comprises a second bias transistor turned on based on a second bias signal to generate the second output signal,
    the amplifier further comprises a second filter circuit including a second bias capacitor connected to the second bias transistor and the second amplification transistor to generate the second bias signal using a second bias voltage, and
    the second filter circuit adjusts a voltage of the second bias capacitor such that a third voltage of the second bias capacitor in the disabled state corresponds to a fourth voltage of the second bias capacitor in the enabled state.

5. The semiconductor device of claim 4, wherein the second bias capacitor is connected to a gate of the second amplification transistor and a gate of the second bias transistor, and the second filter circuit includes a resistor having one end provided with the second bias voltage and the other end connected to one end of the second bias capacitor and the end of the second bias transistor.

6. The semiconductor device of claim 1, wherein the amplifier further comprises a switch circuit configured to provide a second bias voltage to one end of the first bias capacitor in the disabled state and provide the first amplification signal to one end of the first bias capacitor in the enabled state.

7. The semiconductor device of claim 6, wherein the first filter circuit includes a resistor having one end provided with the first bias voltage and the other end connected to the other end of the first bias capacitor and the gate of the first bias transistor.

8. The semiconductor device of claim 6, wherein the switch circuit comprises:
a first switch configured to provide the second bias voltage to one end of the first bias capacitor; and
a second switch configured to provide the first amplification signal to one end of the first bias capacitor.

9. The semiconductor device of claim 6, further comprising a first resistor and a second resistor that generate the second bias voltage from a power supply voltage.

10. A semiconductor device, comprising:
a first amplification circuit configured to output a first amplification signal and a second amplification signal by amplifying a first input signal and a second input signal;
a second amplification circuit including a first amplification transistor turned on based on the first amplification signal to generate a first output signal, a second amplification transistor turned on based on the second amplification signal to output a second output signal, and a first bias transistor turned on based on a first bias signal to generate the first output signal;
a first bias capacitor connected to the first amplification transistor and the first bias transistor;
a first switch circuit configured to provide one of a bias voltage and the first amplification signal to one end of the first bias capacitor; and
a common mode feedback circuit configured to receive the first and second output signals and output a feedback signal that adjusts an average of the first and second output signals to correspond to a reference signal, to the first amplifier.

11. The semiconductor device of claim 10, wherein one end of the first bias capacitor is connected to a gate of the first amplification transistor through the first switch circuit, and the other end of the first bias capacitor is connected to a gate of the first bias transistor.

12. The semiconductor device of claim 11, wherein the first switch circuit comprises:
a first switch configured to provide the bias voltage to one end of the first bias capacitor; and
a second switch configured to provide the first amplification signal to one end of the first bias capacitor.

13. The semiconductor device of claim 12, wherein a magnitude of the bias voltage is smaller than the magnitude of a power supply voltage providing power to the amplifier and is larger than the magnitude of a ground voltage.

14. The semiconductor device of claim 10, further comprising a first resistor and a second resistor that generate the bias voltage from the power supply voltage.

15. The semiconductor device of claim 14, wherein one end of the first bias capacitor is connected to the gate of the first amplification transistor and the first resistor through the first switch circuit, and the other end of the first bias capacitor is connected to the gate of the first bias transistor.

16. The semiconductor device of claim 10, further comprising:
a second bias capacitor; and
a second switch circuit configured to provide one of the bias voltage and the second amplification signal to one end of the second bias capacitor,
wherein the second amplification circuit includes a second bias transistor turned on based on a second bias signal to generate the second output signal, and
the second bias capacitor is connected to the second amplification transistor and the second bias transistor.

17. A communication device, comprising:
a trans-impedance amplifier configured to amplify first and second input signals from a reception mixer; and
a reception filter configured to filter an output of the trans-impedance amplifier,
wherein the trans-impedance amplifier comprises:
a first amplification circuit configured to output a first amplification signal and a second amplification signal by amplifying the first input signal and the second input signal;
a second amplification circuit including a first amplification transistor turned on based on the first amplification signal to generate a first output signal, a second amplification transistor turned on based on the second amplification signal to output a second output signal, and a first bias transistor turned on based on a first bias signal to generate the first output signal;
a first filter circuit including a first bias capacitor connected to the first amplification transistor and the first bias transistor and configured to generate the first bias signal using a first bias voltage; and
a common mode feedback circuit configured to receive the first and second output signals and output a feedback signal that adjusts an average of the first and second output signals to correspond to a reference signal, to the first amplifier,
wherein the first filter circuit adjusts a voltage of the first bias capacitor such that a first voltage of the first bias capacitor in a disabled state in which the amplifier does not perform an amplification operation corresponds to a second voltage of the first bias capacitor in an enabled state in which the amplifier performs the amplification operation.

18. The communication device of claim 17, wherein the trans-impedance amplifier further comprises a switch circuit configured to provide a second bias voltage to one end of the first bias capacitor in the disabled state and provide the first amplification signal to one end of the first bias capacitor in the enabled state.

19. The communication device of claim 18, wherein a magnitude of the second bias voltage is smaller than a magnitude of a power supply voltage providing power to the trans-impedance amplifier and larger than a magnitude of a ground voltage.

20. The communication device of claim 19, wherein the first filter circuit includes a resistor having one end provided with the first bias voltage and the other end connected to the other end of the first bias capacitor and the gate end of the first bias transistor.

* * * * *